(12) United States Patent
Shi et al.

(10) Patent No.: US 7,009,266 B2
(45) Date of Patent: Mar. 7, 2006

(54) METHOD AND SYSTEM FOR PROVIDING A MAGNETIC ELEMENT INCLUDING PASSIVATION STRUCTURES

(75) Inventors: Xizeng Shi, Fremont, CA (US); Po-Kang Wang, San Jose, CA (US); Yimin Guo, San Jose, CA (US); Tai Min, San Jose, CA (US)

(73) Assignees: Applied Spintronics Technology, Inc., Milpitas, CA (US); Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 10/781,479

(22) Filed: Feb. 17, 2004

(65) Prior Publication Data

US 2005/0048674 A1     Mar. 3, 2005

Related U.S. Application Data

(60) Provisional application No. 60/498,686, filed on Aug. 29, 2003.

(51) Int. Cl.
*H01L 29/82* (2006.01)
*H01L 43/00* (2006.01)

(52) U.S. Cl. .............. 257/421; 257/295; 257/296
(58) Field of Classification Search ........... 257/421, 257/422, 424, 68, 296, 295, 108, 906
See application file for complete search history.

(56) References Cited

U.S. PATENT DOCUMENTS

| 6,391,483 B1* | 5/2002 | Zhu et al. ............ 428/692 |
| 6,737,283 B1* | 5/2004 | Morgan ............... 438/3 |
| 6,744,086 B1* | 6/2004 | Daughton et al. ....... 257/295 |

* cited by examiner

*Primary Examiner*—David Nhu
(74) *Attorney, Agent, or Firm*—Sawyer Law Group LLP (57) ABSTRACT

A method and system for providing a magnetic element and a magnetic memory using the magnetic element are disclosed. The magnetic memory includes a plurality of magnetic elements. The method and system include providing a plurality of layers and a passivation layer for each of the plurality of magnetic elements. A portion of the layers in the magnetic element includes at least one magnetic layer. The plurality of layers also has a top and a plurality of sides. The passivation layer covers at least a portion of the plurality of sides.

12 Claims, 7 Drawing Sheets

METHOD AND SYSTEM FOR PROVIDING A MAGNETIC ELEMENT INCLUDING PASSIVATION STRUCTURES

CROSS-REFERENCE TO RELATED APPLICATIONS

This application is claiming under 35 USC 119(e) the benefit of provisional patent application Ser. No. 60/498,686 filed on Aug. 29, 2003.

FIELD OF THE INVENTION

The present invention pertains to reading nonvolatile magnetic memories, such as a magnetic random access memory (MRAM), and more particularly to a method and system for providing a more reliable magnetic element that is less subject to variations due to processing.

BACKGROUND OF THE INVENTION

DRAM, FLASH, and SRAM are the three major conventional semiconductor memories on the market. The manufacturing cost of DRAM is the lowest. However, in addition to shortcomings such as the need for refreshment, relatively low speed and high power consumption, DRAM is volatile. Consequently, a DRAM loses data when the power is turned off. FLASH memory is non-volatility, but is very slow. The write cycle endurance for a FLASH memory is less than one million cycles. This write cycle endurance limits the application of FLASH memories in some high data rate market. SRAM is a fast memory. However, SRAM is volatile and takes too much silicon area per cell. In search of a universal random access memory that offers high speed, non-volatility, small cell area, and good endurance, many companies are developing thin film Magnetic Random Access Memories (MRAM).

Conventional MRAMs can be fabricated with a memory cells using a variety of magnetic elements, such as an Anisotropic Magnetoresistance (AMR) element, a Giant Magnetoresistance (GMR) element, and a Magnetic Tunneling Junction (MTJ) stack. For example, a conventional MTJ stack is relatively simple to manufacture and use. Consequently, an MRAM is used as the primary example herein.

The magnetic field for changing the orientation of the changeable magnetic vector is usually supplied by two conductive lines that are substantially orthogonal to each other. When electrical current passes through the two conductive lines at the same time, two magnetic fields associated with the current in the two conductive lines act on the changeable magnetic vector to orient its direction.

Figure 1A:
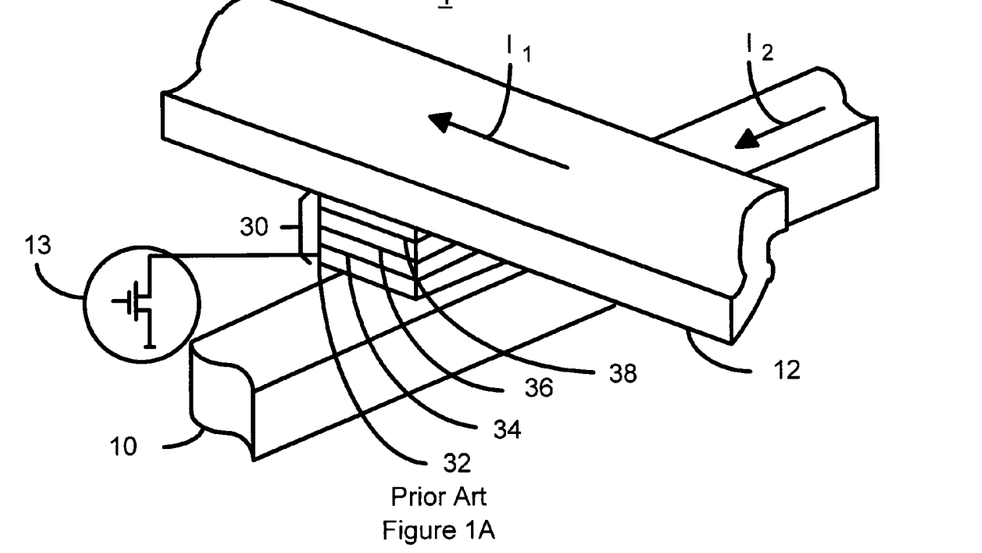
FIG. 1A is a three-dimensional view of a portion of a conventional magnetic memory including a MTJ cell, located at the intersection of a bit line and a word line.

FIG. 1A depicts a portion of a conventional MRAM 1. The conventional MRAM includes conventional orthogonal conductive lines 10 and 12, conventional magnetic storage cell having a conventional MTJ stack 30 and a conventional transistor 13. In some designs, the conventional transistor 13 is replaced by a diode, or completely omitted, with the conventional MTJ cell 30 in direct contact with the conventional word line 10. The conventional MRAM 1 utilizes a conventional magnetic tunneling junction (MTJ) stack 30 as a memory cell. Use of a conventional MTJ stack 30 makes it possible to design an MRAM cell with high integration density, high speed, low read power, and soft error rate (SER) immunity. The conductive lines 10 and 12 are used for writing data into the magnetic storage device 30. The MTJ stack 30 is located on the intersection of and between conventional conductive lines 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 30 stack primarily includes the free layer 38 with a changeable magnetic vector (not explicitly shown), the pinned layer 34 with a fixed magnetic vector (not explicitly shown), and an insulator 36 in between the two magnetic layers 34 and 38. The insulator 36 typically has a thickness that is low enough to allow tunneling of charge carriers between the magnetic layers 34 and 38. Thus, the insulator 36 typically acts as a tunneling barrier between the magnetic layers 34 and 38. Layer 32 is usually a composite of seed layers and an antiferromagnetic (AFM) layer that is strongly coupled to the pinned magnetic layer. The AFM layer included in the layers 32 is usually Mn alloy, such as IrMn, NiMn, PdMn, PtMn, CrPtMn, and so on. The AFM layer is typically strongly exchanged coupled to the pinned layer 34 to ensure that the magnetic vector of the pinned layer 34 is strongly pinned in a particular direction.

When the magnetic vector of the free layer 38 is aligned with that of the pinned layer 34, the MTJ stack 30 is in a low resistance state. When the magnetic vector of the free layer 38 is antiparallel to that of the pinned layer 34, the MTJ stack 30 is in a high resistance state. Thus, the resistance of the MTJ stack 30 measured across the insulating layer 34 is lower when the magnetic vectors of the layers 34 and 38 are parallel than when the magnetic vectors of the layers 34 and 38 are in opposite directions.

Data is stored in the conventional MTJ stack 30 by applying a magnetic field to the conventional MTJ stack 30. The applied magnetic field has a direction chosen to move the changeable magnetic vector of the free layer 30 to a selected orientation. During writing, the electrical current $I_1$ flowing in the conventional bit line 12 and $I_2$ flowing in the conventional word line 10 yield two magnetic fields on the free layer 38. In response to the magnetic fields generated by the currents $I_1$ and $I_2$, the magnetic vector in free layer 38 is oriented in a particular, stable direction. This direction depends on the direction and amplitude of $I_1$ and $I_2$ and the properties and shape of the free layer 38. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Figure 1B:
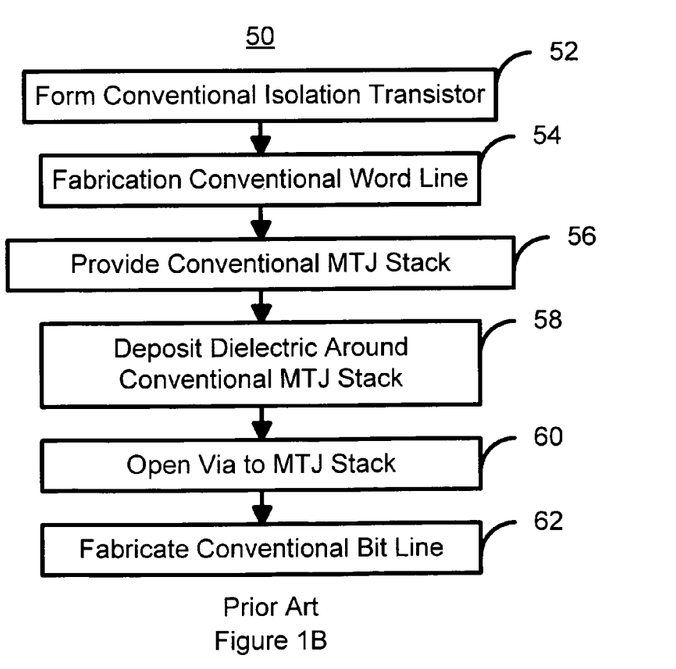
FIG. 1B is a high-level flow chart of a conventional method for providing a conventional magnetic memory using a conventional MTJ stack.

FIG. 1B depicts a conventional method 50 for fabricating the conventional MRAM 1. The isolation transistor 13 is formed on a silicon wafer (not shown), via step 52. The conventional word line 10 is then fabricated using conventional metal layer processes, via step 54. The conventional MTJ stack 30 is then provided, via step 56. Step 56 includes a physical vapor deposition (PVD) process to deposit the multilayer structure and patterning the multilayer structure into the conventional MTJ stack 30 using photolithography and etching processes. After the dimensions of the conventional MTJ 30 are defined in step 56, a layer of dielectric is typically deposited around and on the top of the conventional MTJ stack 30, via step 58.

Figure 1C:
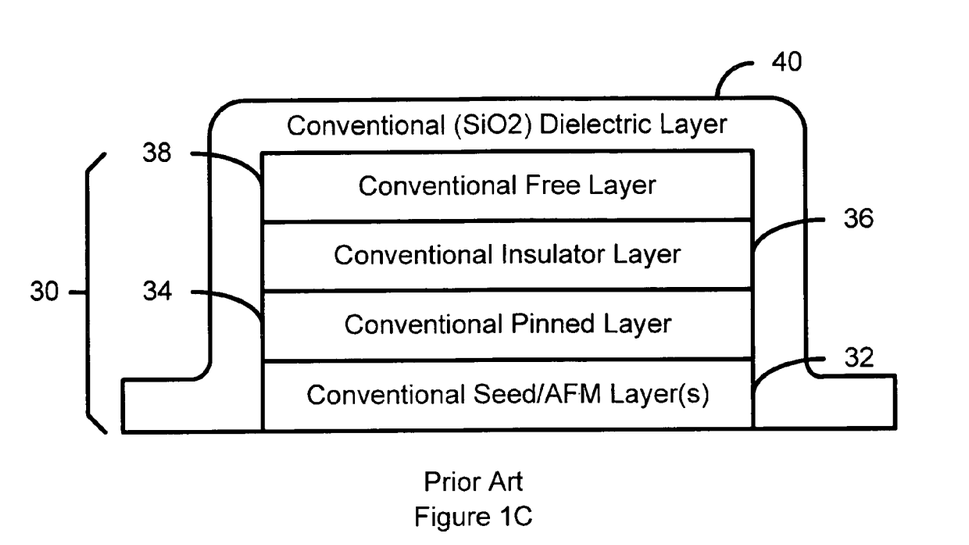
FIG. 1C depicts a conventional MTJ stack enclosed by a dielectric layer.

FIG. 1C depicts the conventional MTJ stack 30 after deposition of the conventional dielectric layer 40 in step 58. The conventional dielectric layer 40 insulates the conventional MTJ stack 30, preventing the conventional MTJ stack 30 from shorting to other elements of the conventional MRAM 1. The conventional dielectric layer 40 may also be used for readying the wafer (not shown) for processes following formation of the conventional MTJ stack 30, such as metal line fabrication. The dielectric commonly used for the conventional dielectric layer 40 in the CMOS industry is $SiO_2$, which can be deposited and etched conveniently with the widely used CMSO processes. It is also a common practice to deposit the dielectric layer on the full wafer so both the edges and the top of the conventional MTJ slack 30 are covered and protected.

Referring to FIGS. 1B and 1C, if the top of the conventional MTJ stack 30 is covered by the conventional dielectric layer 30, a photolithography step and an etching process are used to open a via (not shown) to the top of the conventional MTJ stack 30, via step 60. Thus, the bit line 12 can make contact with the conventional MTJ stack 30. The bit line 12 is then fabricated with conventional CMOS processes, via step 62. Finally, any back-end processing required to complete formation of the conventional MRAM 1 are performed, via step 64.

Although the conventional method 50 functions, one of ordinary skill in the art will readily recognize that the performance of the conventional MRAM 1 may degrade due to processing occurring after formation of the conventional MTJ stack 30. The processing temperature in step 62 or the conventional bit line 12, as well as other following on processes in step 64, can be a few hundred degrees Celsius. At such a temperature, the oxygen in the conventional dielectric layer 40 surrounding the conventional MTJ stack 30 can diffuse into the conventional MTJ stack 30. This oxygen can oxidize the magnetic materials used in the conventional free layer 38 and the conventional pinned layer 34. The magnetic properties of the conventional magnetic layers 34 and 38, such as the effective thicknesses and the coercivities, change depending on the degree of oxidation. Consequently, the conventional magnetic layers 34 and 38 may not behave as expected or desired. Furthermore, the oxygen can diffuse along the insulator 36 that acts as a tunneling barrier between the pinned layer 34 and the free layer 38. The oxygen can further oxidize the interfaces between the insulator 36 and the magnetic layers 34 and 38. As a result, the resistance of the conventional MTJ stack 30 increases and the variation in resistance with the direction of the magnetic vector of the free layer decreases (the Magnetoresistance), causing a deterioration of signal of the MRAM device. Thus, performance of the conventional MTJ stack 30 may be compromised.

Accordingly, what is needed is a method and system for providing a magnetic memory capable of having improved reliability and performance between elements.

SUMMARY OF THE INVENTION

The present invention provides a method and system for providing a magnetic element and a magnetic memory using the magnetic element. The magnetic memory includes a plurality of magnetic elements. The method and system comprise providing a plurality of layers and a passivation layer for each of the plurality of magnetic elements. A portion of the plurality of layers in the magnetic element includes at least one magnetic layer. The plurality of layers also has a top and a plurality of sides. The passivation layer covers at least a portion of the plurality of sides.

According to the system and method disclosed herein, the present invention provides a method for providing a magnetic memory element that has improved performance and reduced susceptibility to back end processing conditions.

DETAILED DESCRIPTION OF THE INVENTION

The present invention provides a method and system for reading a magnetic memory including a plurality of magnetic elements. The method and system comprise determining a first resistance of at least one of the plurality of magnetic elements. The method and system also comprise applying a disturb magnetic field to the at least one of the plurality of magnetic elements and determining a second resistance of the at least one of the plurality of magnetic elements while the disturb magnetic field is applied. The method and system further comprise comparing the first resistance to the second resistance.

The present invention provides a method and system for providing a magnetic element and a magnetic memory using the magnetic element. The magnetic memory includes a plurality of magnetic elements. The method and system comprise providing a plurality of layers and a passivation layer for each of the plurality of magnetic elements. A portion of the plurality of layers in the magnetic element includes at least one magnetic layer. The plurality of layers also has a top and a plurality of sides. The passivation layer covers at least a portion of the plurality of sides.

The present invention will be described in terms of particular types of magnetic memory elements, particular materials, and a particular configuration of elements. For example, the present invention will be described in the context of illustrative magnetic random access memory (MRAM) cells. One of ordinary skill in the art will, however, recognize that the present invention is not limited to any particular magnetic memory devices. Thus, one of ordinary skill in the art will readily realize that this method and system will operate effectively for other magnetic memory cells, and other materials and configurations non inconsistent with the present invention. Instead, the present invention is applicable to other magnetic memory devices. For example, although certain magnetic tunneling junction (MTJ) stacks are described, nothing prevents the use of other materials, other alloys and synthetic layers, or other magnetic elements. In addition, although the present invention is described in the context of metal-oxide-semiconductor (MOS) devices and MTJ stacks, one of ordinary skill in the art will readily recognize that the present invention is not limited to such devices. Instead, other suitable devices, for example bipolar junction transistor devices and spin-valve giant magnetoresistive memory elements, may be similarly used, with or without modification to the memory architecture. One of ordinary skill in the art will also readily recognize that although the present invention is described in the conjunction of certain other components, such as word and bit lines, having certain materials and locations. However, one of ordinary skill in the art will readily recognize that other components and/or components having different locations not inconsistent with the present invention can be used. Moreover, the present invention is described in the context of single constituents, such as a single MTJ stack and a single word line. However, one of ordinary skill in the art will readily recognize that the method and system apply to and operate effectively for systems having multiple constituents of each type such as multiple magnetic elements, multiple bit lines, and multiple word lines.

Figure 2A:
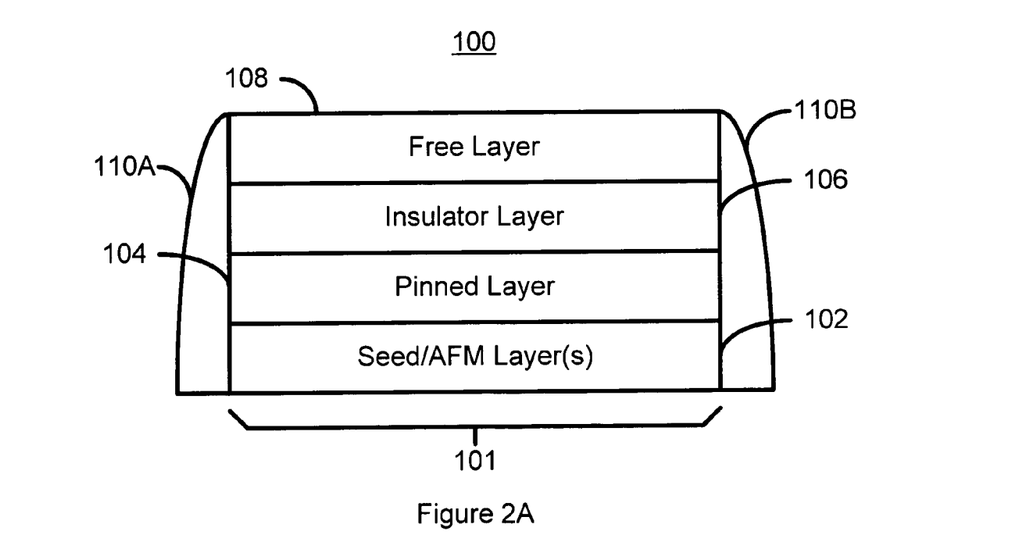
FIG. 2A depicts a first embodiment of a magnetic element in accordance with the present invention.

To more particularly illustrate the method and system in accordance with the present invention, refer now to FIG. 2A depicting a first embodiment of a magnetic element 100 in accordance with the present invention. The magnetic element 100 includes passivation layers 110A and 110B as well as storage portion that is preferably a MTJ stack including at least layers 102, a pinned layer 104, an insulator layer 106, and a free layer 108. However, another type of magnetic element could be used. The layers 102 preferably include at least one seed layer and an AFM layer used to pin the magnetization of the pinned layer 104. The insulator layer 106 is a tunneling barrier between the pinned layer 104 and the free layer 108 and is preferably $Al_2O_3$. The magnetization of the free layer 108 rotates in response to an external magnetic field and thus is used to store data. Based upon the orientations of the magnetizations of the free layer 108 and pinned layer 104 (antiparallel or parallel), the resistance of the magnetic element 100 changes. Thus, the magnetic element 100 functions in an analogous manner to a conventional magnetic element.

The magnetic element 100 also includes a passivation layer 110A and 110B, which reside on the sidewalls of the MTJ stack 101 including the layers 102, 104, 106, and 108. The components 110A and 110B are preferably formed from a single layer. Thus, although physically separate, they are termed a passivation layer. The passivation layer 110A and 110B shields portions of the magnetic element 100 from diffusion of certain materials from a dielectric layer (not shown) at certain elevated temperatures. In the embodiment shown in FIG. 2A, the passivation layers 110A and 110B act as diffusion barriers for at least a portion of the sides of the MTJ stack 101 including layers 102, 104, 106, and 108. The dielectric layer (not shown) generally used to surround the magnetic element 100 is $SiO_2$. Thus, the passivation layer 110A and 110B preferably reduces or substantially blocks diffusion of oxygen, particularly during fabrication of a magnetic memory utilizing the magnetic element 100. In the magnetic element 100, the passivation layer 110A and 110B reduce or substantially prevent diffusion of at least oxygen into at least a portion of the sides of the layers 102, 104, 106, and 108 of the magnetic element 100.

In addition, note that the MTJ stack 101 of the magnetic element generally should not experience temperatures above approximately three hundred fifty to four hundred degrees centigrade. If temperatures above this range (for example temperatures above five hundred degrees centigrade) are experienced, interlayer diffusion may cause severe damage to the MTJ stack 101. Thus, the materials used in forming the passivation layer 110A and 110B are preferably capable of being fabricated at lower temperatures, below five hundred degrees centigrade. In a preferred embodiment, the materials used in forming the passivation layer 110A and 110B can be fabricated at temperatures at or below the three hundred fifty to four hundred degree centigrade range.

In particular, the materials for the passivation layer 110A and 110B are selected to reduce or block diffusion of materials, such as oxygen, into portions of the MTJ stack including layers 102, 104, 106, and 108. Thus, the materials used are preferred to be nitride dielectric films such as $Si_3N_4$ or AlN. The material $Si_3N_4$ generally acts as an impervious barrier to diffusion of oxygen and many other elements. In addition, $Si_3N_4$ can be prepared by plasma enhanced chemical vapor deposition (PECVD) to have a low compressive stress. A low compressive stress allows the passivation layer 110A and 110B to be subjected to severe environmental stress with a lower probability of delamination or cracking. A low stress in the film can also prevent the magnetic films 104 and 108 from exhibiting stress related property variations. Moreover, $Si_3N_4$ has an acceptable (low) pinhole density and provides excellent conformal coverage to the under lying structures. Similarly, as described below, $Si_x N_y H_z$, where x, y, and z are numbers, could be used.

In order to form the passivation layers 110A and 110B, using $Si_3N_4$ without unduly damaging the MTJ stack 101, the $Si_3N_4$ passivation layer 110A and 110B can be deposited by PECVD process in a temperature range of approximately two hundred to four hundred degrees centigrade. The overall deposition reaction can be written as $$SiH_4(gas)+NH_3(or\ N_2)(gas) \xrightarrow[rf]{200-400°\ C.,} Si_xN_yH_z(solid)+H_2(gas)$$

As can be seen from the above reaction, the $Si_3N_4$ passivation layer 110A and 110B prepared by PECVD may be $Si_x N_y H_z$ which contains H. However, the passivation layer 110A and 110B made of such a material can act as a diffusion barrier.

As discussed above, another preferred material to use in the passivation layer 110A and 110B, is AlN, which is a highly stable covalent compound exhibiting an unusual combination of high thermal conductivity and high electrical insulation. If the passivation layer 110A and 110B includes AlN, the AlN should also be formed without severely damaging the MTJ stack 101 due to high temperature processing. To be compatible with the relative low processing temperature requirement of the MTJ stack 101 a plasma deposition is used. AlN can be deposited in a temperature range of approximately two hundred to eight hundred degree centigrade with plasma. The deposition reaction is $$AlBr_3+NH_3 \xrightarrow{200-800°\ C., plasma} AlN+3HBr$$

In other embodiments, however, the passivation layer 110A and 110B could have other compositions. For example, the passivation layers 110A and 110B could include $Al_xO_y$. In such an embodiment (or an alternate embodiment), the composition of the passivation layers 110A and 110B may be the same as the insulator layer 106 of the MTJ structure. Note that both the elements in the material (in the example Al and O) and the stoichiometries of the passivation layers 110A and 110B and the insulator layer 106 are the same. The same material as the insulator layer 106 can thus be used for the passivation layers 110A and 110B. Using the same materials for the layers 106 and 110A and 110B works well if the performance degradation of the MTJ stack 101 of the magnetic element 100 is related to further oxidation of the insulator layer 106 but not the magnetic layers 104 and 108. For the passivation layer 110A and 110B to have the same stoichiometry as the insulator layer 106, the fabrication process for the insulator layer 106 is preferably used to form the passivation layers 110A and 110B. Consequently, process conditions are also preferred to be the same. If the passivation layer 110A and 110B has the same stoichiometry as the insulator layer 106, the oxygen distribution in both the insulator layer 106 and the passivation layer 110A and 110B would be the same. Therefore, diffusion of oxygen from one layer to the other could be avoided, thereby preventing further oxidation of the insulator layer 106. Thus, the resistance of the MTJ stack 101 of the magnetic element 100 would not increase due to oxygen diffusion.

In another embodiment, tantalum oxide could be used for the passivation layer 110A and 110B. The stable form of tantalum oxide is tantalum pentoxide, $Ta_2O_5$. However, the as deposited form can be oxygen deficient if MOCVD is used as the deposition process. Tantalum oxide for the passivation layer 110A and 110B can also be prepared by depositing tantalum followed by an oxidation process.

Figure 2B:
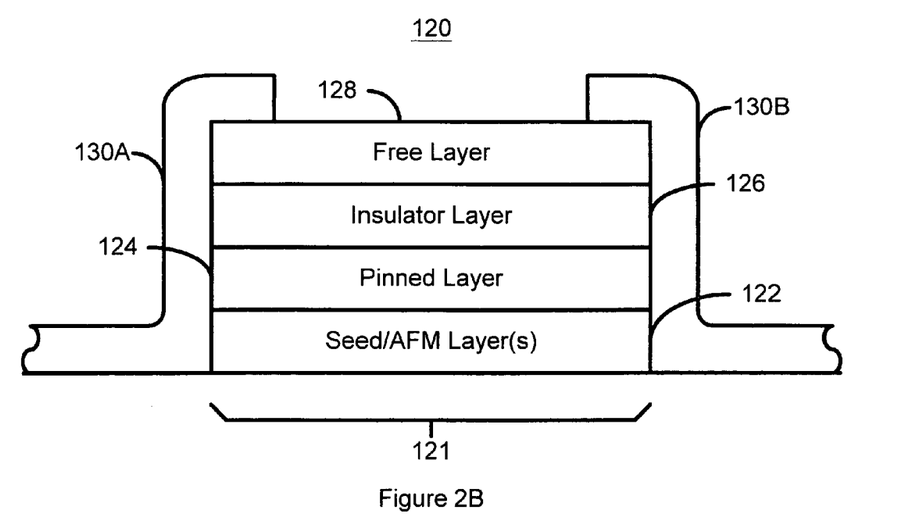
FIG. 2B depicts a second embodiment of a magnetic element in accordance with the present invention.

FIG. 2B depicts a second embodiment of a magnetic element 120 in accordance with the present invention. The magnetic element 120 includes an MTJ stack 121 including layers 122, 124, 126, and 128. The MTJ stack 121 is analogous to the MTJ stack 101 depicted in FIG. 2A and will, therefore, not be further described. Referring to FIGS. 2A and 2B, the magnetic element 120 also includes a passivation layer 130A and 130B. The passivation layer 130A and 130B covers the sides and a portion of the top of the MTJ stack 121. In addition, the passivation layer 130A and 130B covers the surfaces between MTJ stacks 121. Thus, the only apertures opened in the passivation layer 130A and 130B are preferably those above the MTJ stack 121. The materials used for and processes used in forming the materials for the passivation layer 130A and 130B are substantially the same as for the passivation layer 110. For example, $Si_3N_4$, $Si_zN_yH_z$, AlN, $Ta_2O_5$ and the same material as the insulator layer 126 could be used for the passivation layer 130A and 130B.

The passivation layer 130A and 130B is a single layer covering the top and sides of the MTJ stack 121, rather than only the sides of the MTJ stack as for the passivation layer 110. As a result, the passivation layer 130A and 130B may provide greater protection against diffusion than the passivation layer 110A and 110B of FIG. 2A. Portions of the MTJ stack 101 of FIG. 2A might be exposed to the dielectric layer (not shown) and diffusion of undesirable materials. For example, if the etch that defines the MTJ stack 101 does not result in vertical sidewalls, the passivation layer 110A and 110B may not completely cover the sides of the MTJ stack 101. Similarly, misalignments may also result in the passivation layer 110A and 110B providing incomplete coverage. The use of the passivation layer 130A and 130B covering both the tops and the sides, as well as a portion of the layer underlying the MTJ stack 121, is less sensitive to issues such as non-vertical sidewalls and can reduce the diffusion of unwanted materials into the MTJ stack 121.

Figure 2C:
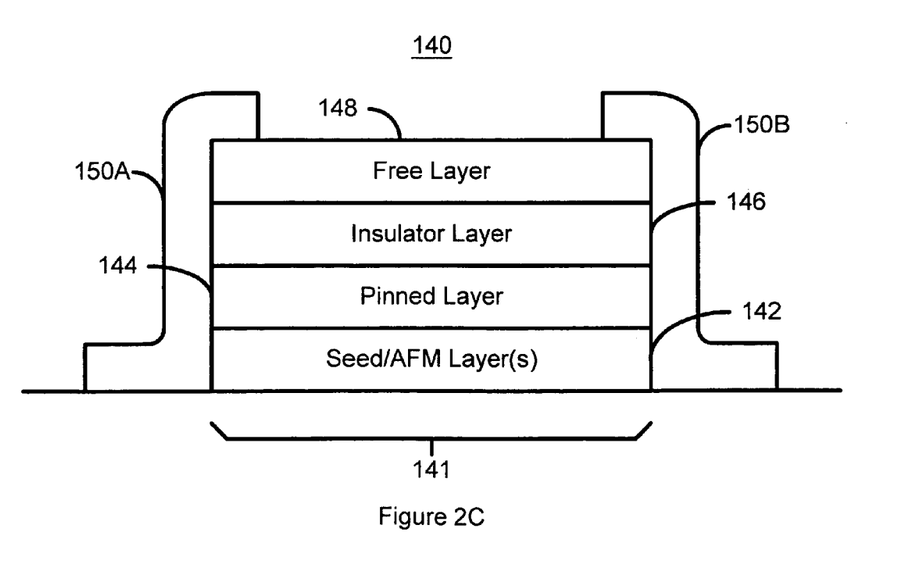
FIG. 2C depicts a third embodiment of a magnetic element in accordance with the present invention.

FIG. 2C depicts a third embodiment of a magnetic element 140 in accordance with the present invention. The magnetic element 140 includes an MTJ stack 141 including layers 142, 144, 146, and 148. The MTJ stack 141 is analogous to the MTJ stack 101 depicted in FIG. 2A and will, therefore, not be further described. Referring to FIGS. 2A and 2C, the magnetic element 140 also includes a passivation layer 150A and 150B. The passivation layer 150A and 150B covers the sides and a portion of the top of the MTJ stack 141. The materials used for and processes used in forming the materials for the passivation layer 150A and 150B are substantially the same as for the passivation layer 110. For example, $Si_3N_4$, $Si_zN_yH_z$, AlN, $Ta_2O_5$ and the same material as the insulator layer 146 could be used for the passivation layer 150A and 150B.

The passivation layer 150A and 150B covers the sides and a portion of the top of the MTJ stack 141, rather than covering only the sides of the MTJ stack as for the passivation layer 110. In addition, in one embodiment, a portion of the passivation layer 150A and 150B covers part of the underlying layer adjacent to the MTJ stack 141, as depicted in FIG. 2C. Thus, the passivation layer 150 functions in a similar manner to the passivation layer 130A and 130B. As a result, the passivation layer 150 may provide greater protection against diffusion than the passivation layer 110A and 110B.

The passivation layers 110A and 110B, 130A and 130B, and 150A and 150B improve the performance of the magnetic element 100, 120, and 140, respectively. In particular, the sensitivity of the MTJ stacks 101, 121, and 141 to back end processing is reduced. The passivation layers 110A and 110B, 130A and 130B, and 150A and 150B prevent or reduce the diffusion of materials into the MTJ stacks 101, 121, and 141, respectively, during fabrication of the magnetic elements 100, 120A, and 140, respectively. As a result, additional oxidation of the insulator layer 106, 126, and 146 may be avoided. Thus, inadvertent increases in the resistance and attendant decreases in the magnetoresistance and signal of the magnetic elements 100, 120, and 140, can be reduced or avoided. Similarly, oxidation of the magnetic layers 104, 108, 124, 128, 144, and 148 may be prevented. Thus, undesired and uncontrolled changes in the magnetic properties of the magnetic elements 100, 120, and 140 may be reduced or avoided. Consequently, performance of the magnetic elements 100, 120, and 140 is improved.

Figure 3:
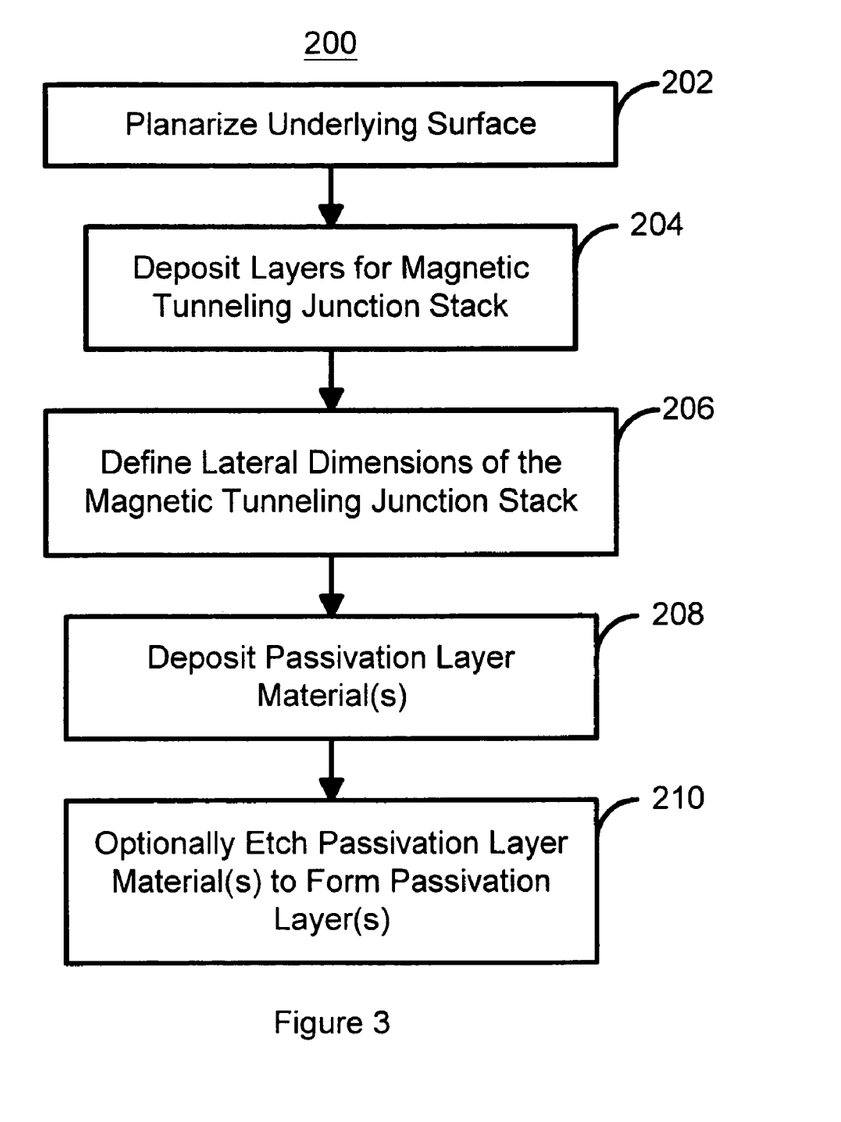
FIG. 3 depicts a high-level flow chart of one embodiment of a method for providing a magnetic element in accordance with the present invention.

FIG. 3 depicts a high-level flow chart of one embodiment of a method 200 for providing a magnetic element in accordance with the present invention. The method 200 preferably commences after formation of the transistor, such as the transistor 13 depicted in FIG. 1A. If a word line resides below the magnetic element, then the method 200 also preferably commences after formation of the word line. For clarity, the method 200 is described in the context of the magnetic element 100. However, one of ordinary skill in the art will readily recognize that the method 200 can apply to other magnetic elements in accordance with the present invention, such as the magnetic elements 120 and 140.

The surface on which the MTJ stack 101 will be formed is planarized, via step 202. The layers of the MTJ stack 101, which preferably include the seed/AFM layer 102, the pinned layer 104, the insulator layer 106 and the free layer 108, are deposited on the planarized surface, via step 204. Step 204 thus preferably includes depositing and oxidizing the insulator layer 106. The lateral dimensions of the MTJ stack 101 are defined, via step 206. Step 206 generally includes a photolithography and an etching process. After the memory device is cleaned to substantially remove photoresist residue, the material for the passivation layer 110A and 110B is deposited, via step 208. Depending on the material used, one or more of the different processes and reactions described above may be used. For example, PECVD might be used to attempt to obtain a Si₃N₄ layer, while plasma deposition may be used for providing an AlN layer. In any case, however, the deposition carried out in step 208 is performed in a manner which does not unduly affect the performance of the magnetic element 100. Consequently, conformal deposition at a temperature below 350° C. is preferred for the step 208.

The dielectric material deposited in step 208 is optionally etched to form the passivation layers 110A and 110B, via step 210. Thus, for the magnetic element 100, step 210 utilizes an anisotropic etching process that only etches the plane surfaces but not the vertical surfaces. The parameters for this anisotropic etching step are selected such the surfaces in the horizontal plane would become free from the dielectric material of the sidewall spacer while the side of the MTJ stack 101 would enclosed by the passivation layer 110A and 110B. In an alternate embodiment, step 208 may include a photolithography followed by an etching process to define the geometry of the passivation layer. Such a step may result in the passivation layer 150A and 150B depicted in FIG. 2C. Thus, a substantial portion of the top surface of the free layer 148 would be exposed for making electrical contact with other electronic circuit. However, the edge of the top surface of the free layer 148 would be covered by the passivation layer 150A and 150B to accommodate process tolerance in the photolithography and etching process. A portion of the plane surface on which the MTJ stack 121 is deposited may also be covered by the passivation layer 150A and 150B. In this case, it is not necessary to remove the passivation material on the surface on which the MTJ stack 121 is deposited. Consequently, the photolithography mask can be modified to only expose the top central portion of the free layer. In this case, the passivation material would cover the whole wafer surface except the top of the free layer 148 of the MTJ stacks 101.

Figure 4:
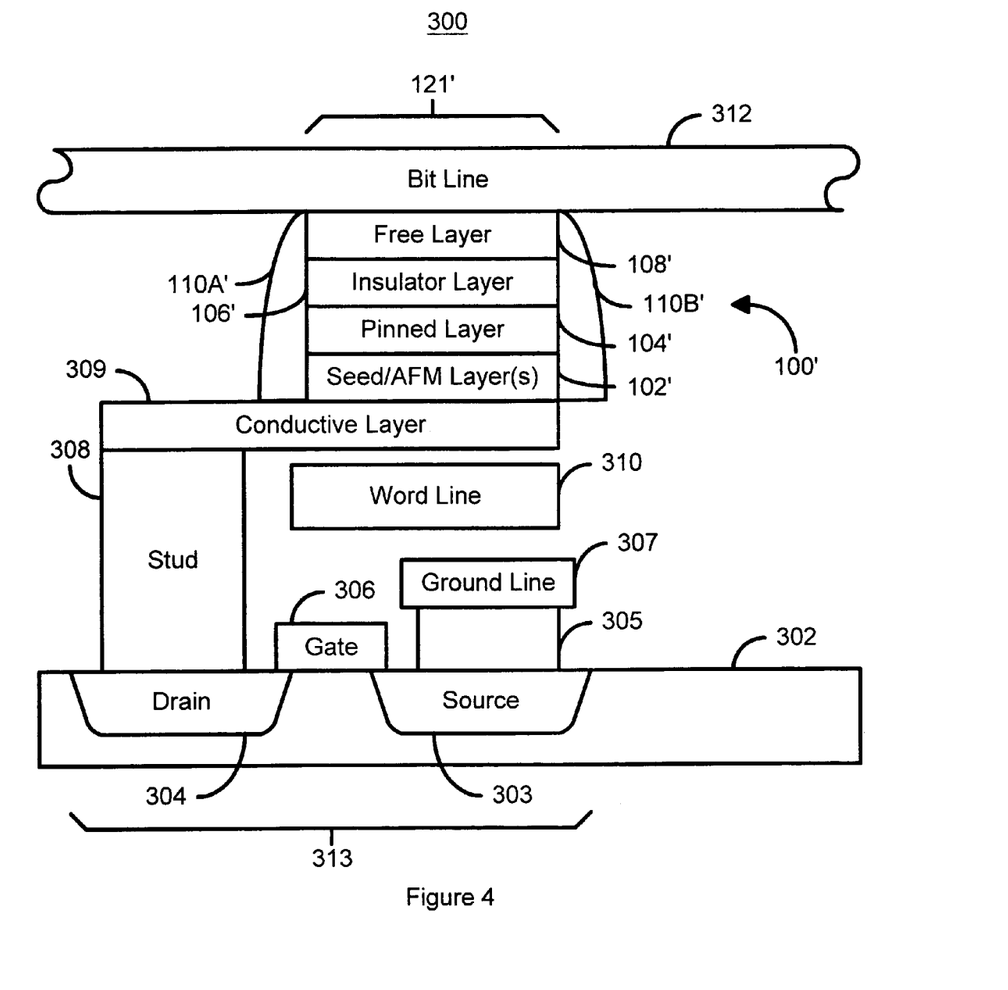
FIG. 4 depicts a first embodiment of a magnetic memory utilizing a magnetic element in accordance with present invention.

FIG. 4 depicts a first embodiment of a magnetic memory 300 utilizing one embodiment of a magnetic element 100' in accordance with present invention. The magnetic memory 300 is preferably an MRAM provided on a substrate 302, such as a silicon wafer. The magnetic element 100' depicted in FIG. 4 is the same as magnetic element 100 shown in FIG. 2A. However, nothing prevents the use of the magnetic elements 120 and 140 depicted in FIGS. 2B and 2C, respectively. The magnetic element 100' includes the layers 102', 104', 106', and 108' and passivation layers 110A' and 110B' that are preferably the same as depicted in FIG. 2A. Referring back to FIG. 4, the magnetic memory 300 also includes a word line 310, a bit line 312, a ground line 307, a transistor 313, a conductive stud 308, and a conductive layer 309. The transistor 313 is preferably a MOS transistor including a source 303, a drain 304, and a gate 306. The source 303 is coupled to the ground line 307 through another plug 305.

The bottom surface of the seed/AFM layer 102' is connected to the conductive layer 309, which is connected to the drain 304 of the transistor 313 through the stud 308. The top of the free layer 108' is connect to the bit line 312, which preferably carries a write current during writing and provides a read current to the MTJ stack 101' during reading. The word line 310 is used for writing and is preferably oriented orthogonal to the bit line 312. Because the magnetic element 100' includes passivation layer 110A' and 110B' and because the top and bottom surfaces of the MTJ stack 101' are enclosed by metallic conductors, oxygen diffusion into the MTJ stack 101' from the surrounding structures is significantly reduced. Performance degradation of the MTJ stack 121' related to undesired oxidation of the layers 102', 104', 106', and 108' of the MTJ stack 121' during subsequent processing of the magnetic memory 300 can be substantially prevented. Performance of the magnetic memory 300 is, therefore, improved.

Figure 5:
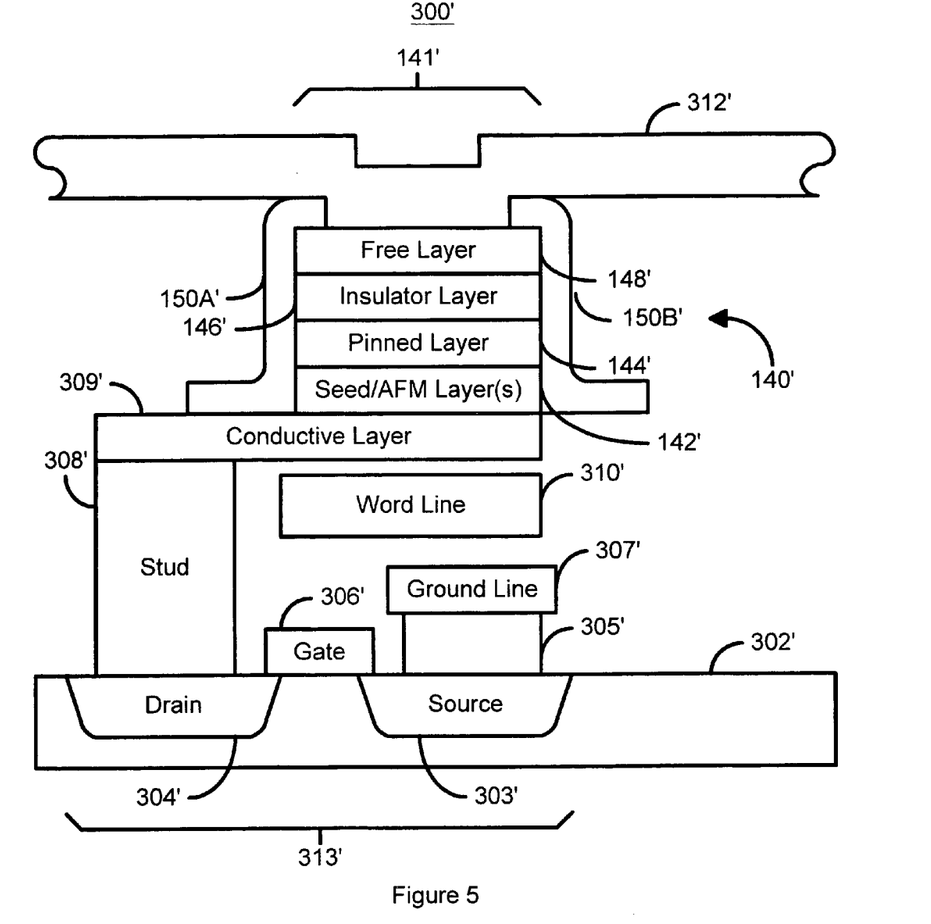
FIG. 5 depicts a third embodiment of a magnetic memory utilizing a magnetic element in accordance with present invention.

FIG. 5 depicts an alternate embodiment a magnetic memory 300' utilizing a magnetic element 140 in accordance with present invention. The magnetic memory 300' is substantially the same as the magnetic memory 300 depicted in FIG. 4. However, as discussed above, it is possible to use another magnetic element, such as the magnetic element 120 or 140, in the magnetic memory 300. Thus, the magnetic memory 300' utilizes the magnetic element 140' and is fabricated using the substrate 302'. The magnetic element 140' is substantially the same as the magnetic element 140 depicted in FIG. 2C. The magnetic memory 300' is thus substantially the same as the magnetic memory 300. Consequently, the magnetic element 140 include a stack 141' having layers 142', 144', 1406', and 148' and passivation layers 150A' and 150B', a word line 310', a bit line 312', a ground line 307', a transistor 313', a conductive stud 308', and a conductive layer 309'. The transistor 313 is preferably a MOS transistor including a source 303', a drain 304', and a gate 306'. The source 303' is coupled to the ground line 307' through another plug 305'. However, the bit line 312' has an uneven surface due to the shape of the passivation layer 150A' and 150B'. The magnetic memory 300' thus shares the benefits of the magnetic memory 300. In addition, for the reasons described above with respect to the magnetic element 140, the magnetic element 140' has additional protection against oxygen diffusion even in the presence of non-vertical sidewalls, misalignments, or other issues. Consequently, the performance of the magnetic memory 300' is even less likely to degrade due to back end processing of the magnetic memory 300'.

Figure 6:
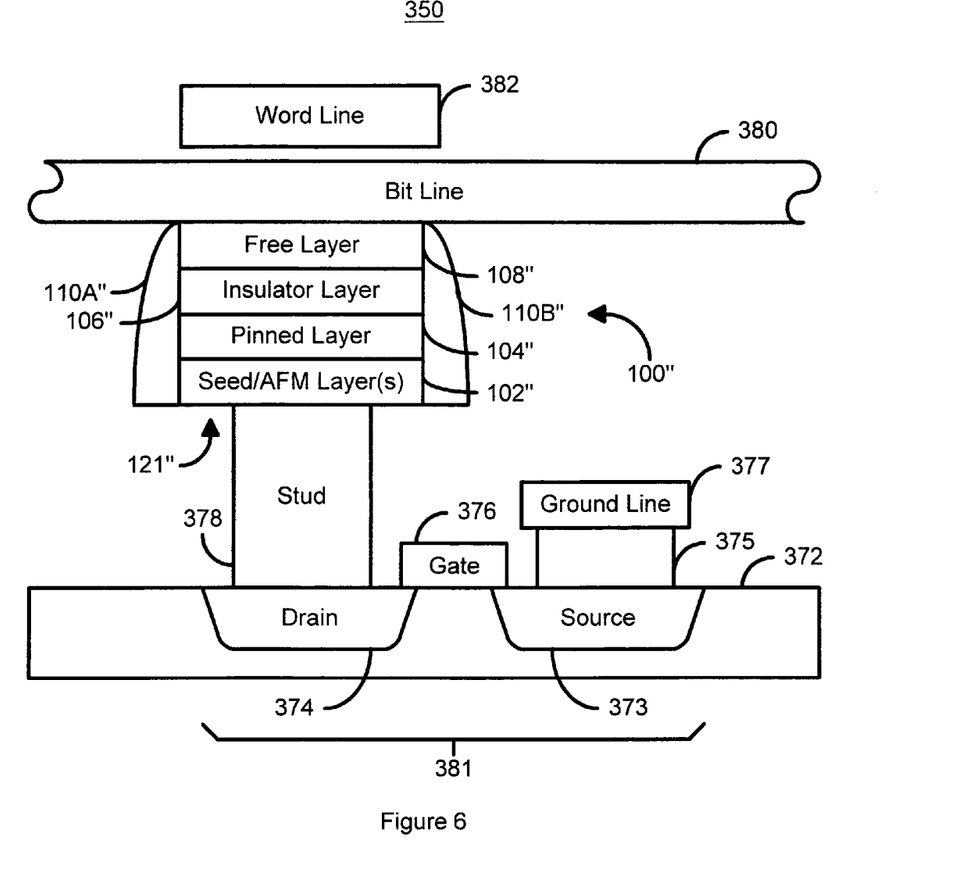
FIG. 6 depicts a second embodiment of a magnetic memory utilizing a magnetic element in accordance with present invention.

FIG. 6 depicts a second embodiment of a magnetic memory 350 utilizing a magnetic element 100" in accordance with present invention. The magnetic memory 350 is preferably an MRAM provided on a substrate 352, such as a silicon wafer. The magnetic element 100" depicted in FIG. 4 is the same as magnetic element 100 shown in FIG. 2A. However, nothing prevents the use of the magnetic elements 120 and 140 depicted in FIGS. 2B and 2C, respectively. The magnetic element 100" includes an stack 121' having the layers 102", 104", 106", and 108'" and passivation layers 110A" and 110B" that are preferably the same as depicted in FIG. 2A. Referring back to FIG. 6, the magnetic memory 350 also includes a word line 382, a bit line 380, a ground line 377, a transistor 381, and a conductive stud 378. The transistor 381 is preferably a MOS transistor including a source 373, a drain 374, and a gate 376. The source 373 is coupled to the ground line 377 through another plug 375. The bit line 380 carries a write current during writing and provides a read current during reading. The word line 382 carries a current during writing and, in contrast to the magnetic memory 300, is located below the magnetic element 100'.

A method and system has been disclosed for providing an improved magnetic element preferably for use in a magnetic memory. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
a plurality of layers, a portion of the plurality of layers including at least one magnetic layer, the plurality of layers including a top and a plurality of sides; and
a passivation layer covering at least a portion of the plurality of sides, the passivation layer being an oxygen diffusion barrier layer composed of at least one material free of SiN and AlO.

2. The magnetic element of claim 1 wherein the passivation layer further covers a portion of the top of the plurality of layers.

3. The magnetic element of claim 1 wherein the magnetic element resides on a surface and wherein the passivation layer further covers a portion of the surface residing next to the magnetic element.

4. The magnetic element of claim 1 wherein the plurality of layers further include a pinned layer, a free layer, and an insulating layer residing between the pinned layer and the free layer.

5. The magnetic element of claim 1 wherein the passivation layer further includes $Si_3N_4$.

6. A magnetic element comprising:
a plurality of layers, a portion of the plurality of layers including at least one magnetic layer, the plurality of layers including a top and a plurality of sides; and
a passivation layer covering at least a portion of the plurality of sides;
wherein the passivation layer further includes AlN.

7. A magnetic element comprising:
a plurality of layers, a portion of the plurality of layers including at least one magnetic layer, the plurality of layers including a top and a plurality of sides; and
a passivation layer covering at least a portion of the plurality of sides;
wherein the passivation layer further includes $Ta_3O_4$.

8. A magnetic element comprising:
a plurality of layers, a portion of the plurality of layers including at least one magnetic layer, the plurality of layers including a top and a plurality of sides; and
a passivation layer covering at least a portion of the plurality of sides;
wherein the passivation layer further includes $Si_xN_yH_z$, where x, y, and z are numbers.

9. The magnetic element of claim 1 wherein the passivation layer further includes $Al_xO_y$, where x and y are numbers.

10. A magnetic element comprising:
a plurality of layers, a portion of the plurality of layers including at least one magnetic layer, the plurality of layers including a top and a plurality of sides; and
a passivation layer covering at least a portion of the plurality of sides;
wherein the plurality of layers includes an insulating tunneling barrier composed of at least one material having a first stoichiometry and wherein the passivation layer includes the at least one material having the first stoichiometry.

11. A magnetic memory comprising:
a plurality of magnetic elements, each of the plurality of magnetic elements including a plurality of layers and a passivation layer, a portion of the plurality of layers including at least one magnetic layer, the plurality of layers including a top and a plurality of sides, the passivation layer covering at least a portion of the plurality of sides, the passivation layer including at least one of AlN, $Si_xN_yH_z$ where x, y, and z are numbers, $Ta_3O_4$, and at least one material having a first stoichiometry for the plurality of layers including a tunneling barrier layer including the at least one material having the first stoichiometry; and
a plurality of word lines, each of the plurality of word lines residing below a portion of the plurality of magnetic elements.

12. A magnetic memory comprising:
a plurality of magnetic elements, each of the plurality of magnetic elements including a plurality of layers and a passivation layer, a portion of the plurality of layers including at least one magnetic layer, the plurality of layers having a top and a plurality of sides, the passivation layer covering at least a portion of the plurality of sides, the passivation layer including at least one of AlN, $Si_xN_yH_z$ where x, y, and z are numbers, $Ta_3O_4$, and at least one material having a first stoichiometry for the plurality of layers including a tunneling barrier layer including the at least one material having the first stoichiometry; and
a plurality of word lines, each of the plurality of word lines residing above a portion of the plurality of magnetic elements.

* * * * *